United States Patent [19]
Cox et al.

[11] 3,993,919
[45] Nov. 23, 1976

[54] PROGRAMMABLE LATCH AND OTHER CIRCUITS FOR LOGIC ARRAYS

[75] Inventors: Dennis Thomas Cox, Kingston; Justin Bruce Damerell, Saugerties; Gilbert Joseph Kelly, Red Hook; Roy Arthur Wood, Saugerties, all of N.Y.

[73] Assignee: IBM Corporation, Armonk, N.Y.

[22] Filed: June 27, 1975

[21] Appl. No.: 591,208

[52] U.S. Cl. .............................. 307/279; 307/205; 307/207; 307/247 R; 307/289; 307/DIG. 3; 307/DIG. 5

[51] Int. Cl.$^2$ ................. H03K 3/286; H03K 3/353; H03K 19/08; H03K 19/20

[58] Field of Search ............... 307/238, 279, DIG. 5, 307/207, 247 R, DIG. 3, 205, 289, 291

[56] References Cited
UNITED STATES PATENTS

| | | | |
|---|---|---|---|
| 3,758,761 | 9/1973 | Henrion | 307/238 X |
| 3,761,902 | 9/1973 | Weinberger | 307/238 X |
| 3,849,638 | 11/1974 | Greer | 307/207 X |

OTHER PUBLICATIONS

MacFarlane, "Pulse Generator and Flip–Flops," IEEE Trans. on Instrumentation & Measurement, vol. IM–21, No. 2, 5/1972, pp. 148–153.

*Primary Examiner*—John S. Heyman
*Assistant Examiner*—Larry N. Anagnos
*Attorney, Agent, or Firm*—James E. Murray

[57] ABSTRACT

This specification describes means that permit the variation of circuits, particularly latch circuits, used in programmable logic array chips (PLAs). The latch circuits are changeable to enable the selection of one of three different latch configurations to be used or in combination on the same PLA chip. The differences in the circuit configurations of the different types of latches occur only in metallization pattern of the chip so that chips with different latch configurations can be manufactured with a minimum of different processing steps.

5 Claims, 12 Drawing Figures

TRUE/COMPLEMENT GEN. 1 OF 96

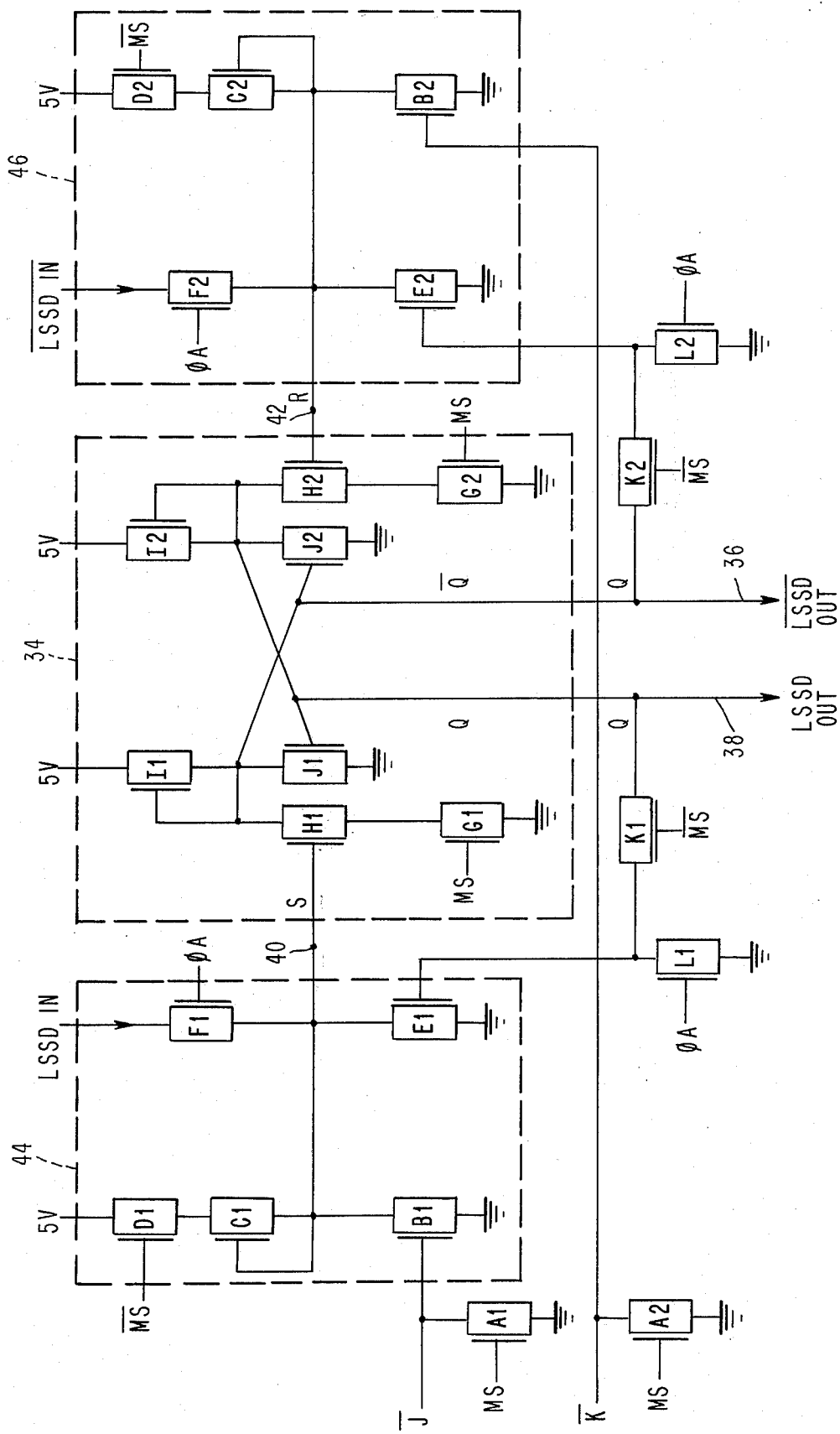

JK PERSONALIZATION

FIG. 10 AND/PH PERSONALIZATION
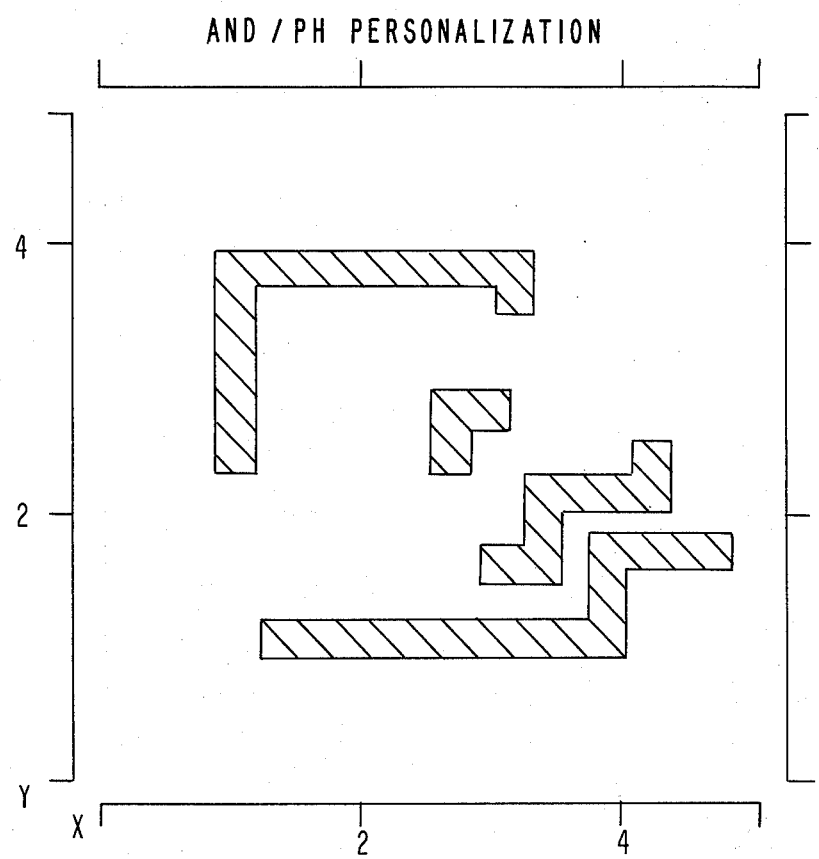
FIG. 11 GATED POLARITY HOLD PERSONALIZATION
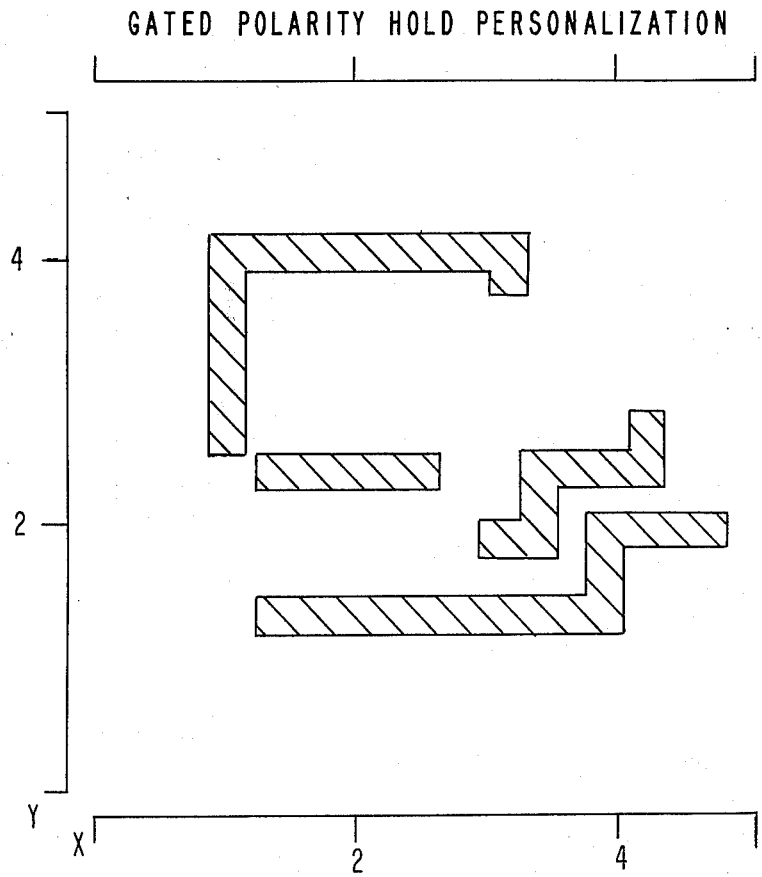

PROGRAMMABLE LATCH AND OTHER CIRCUITS FOR LOGIC ARRAYS

BACKGROUND OF THE INVENTION

The present invention relates to arrays for performing logic functions and more particularly it is related to the manufacture of PLA chips with different circuit configurations.

The performing of logic in an array of identical circuit elements each located at a unique intersection of an input and output line in a grid of intersecting input and output lines is well known. It is also well known to perform logic in a compound arrangement of these arrays called a programmable logic array chip (PLA) by using the outputs of one array as the inputs to another array. Co-pending application Ser. No. 537,219 filed on Dec. 30, 1974 describes such a PLA on which a number of decoders feed inputs to a first array called a product term generator or an AND array which in turn supplies outputs to a second array called a sum of product term generator or an OR array. The outputs of the OR array are then used to control the setting and resetting of a string of latches so that both combinatorial and sequential logic functions can be performed by the PLA. The particular logic functions actually performed by the given PLA are controlled by the locations and number of the active logic circuits in the AND and OR arrays of the PLA and also by how inputs are supplied to the decoders either from off the chip or from the latches. Furthermore, the type of latch used determines the logic functions performed on the PLA chip. Therefore, it is important that a number of different types of latches be available on the PLA chip each in the quantities needed to permit the efficient use of the chip.

THE INVENTION

Therefore, in accordance with the present invention the functions performed by the latch circuits of a PLA and other circuits in the PLA are changeable. These changes can be provided merely by changing the metallization pattern of the PLA chip so that changes can be made at the same time and in the same manner that the arrays of the PLA are personalized in the above mentioned application Ser. No. 537,219.

Therefore it is an object of the present invention to provide a programmable logic array with latches and other circuits that can be personalized to perform specific purposes.

It is another object of the present invention to provide a scheme in which circuits on a logic array can be personalized by the selection of the metallization pattern of the chip.

A further object of the invention is to provide a programmable logic array with latches that can function as either JKs or polarity hold latches depending on the metallization pattern of the chip.

THE DRAWINGS

These and other objects, features and advantages of the invention will be apparent from the following more particular description of the preferred embodiments of the invention of which:

FIG. 5 is a circuit diagram of a JK latch.

FIG. 10 is the metallization pattern peculiar to the circuit of FIG. 6, and

FIG. 11 is the metallization pattern peculiar to the circuit of FIG. 7.

DETAILED DESCRIPTION

Figure 1A:
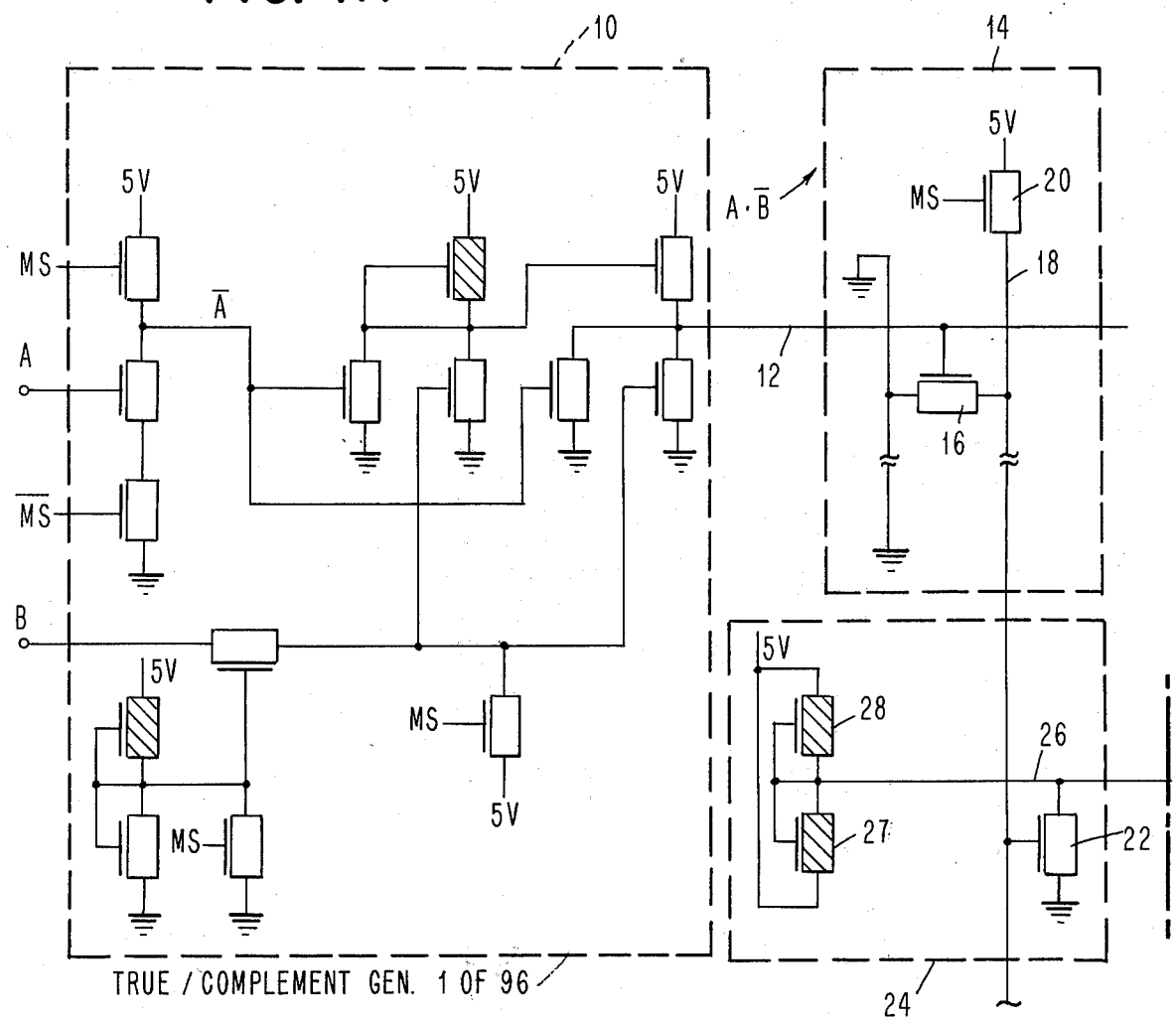
FIGS. 1A and 1B are a circuit diagram showing the circuits to perform logic on a typical pair of inputs to the array of the above mentioned patent application.
Figure 1B:
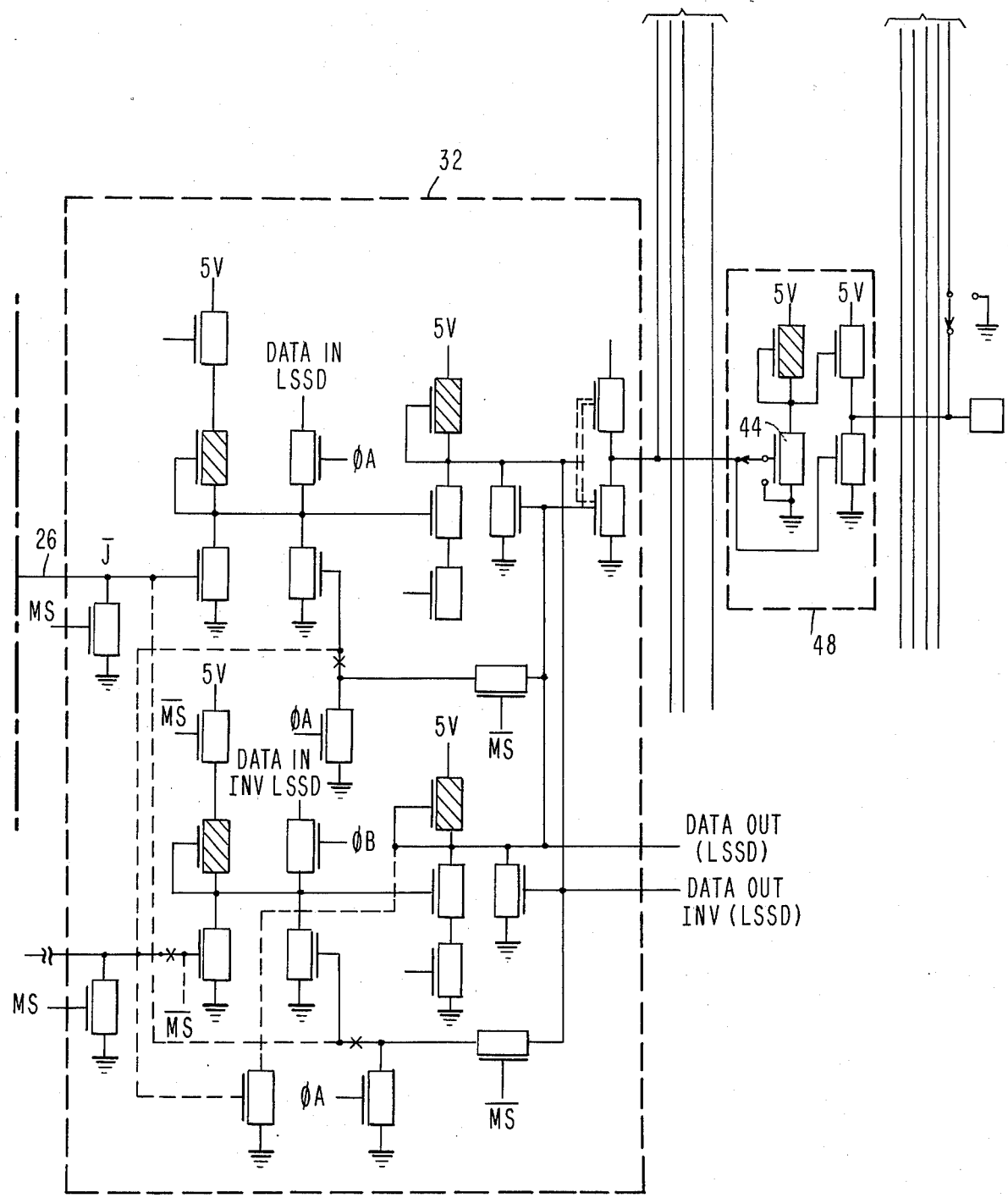

Referring now to FIG. 1 two inputs A and B to the chip are fed to a decoder 10 which in response to the input signals supplies an output on one of four outputs 12. When input A is up and input B is down an up signal is placed on line 12 and fed into the search or AND array. For other combinations of A and B one of the other output lines of the decoder 10 contains the up signal. When the up signal is placed in line 12 any transistor 16 along line 12 in the array is rendered conductive discharging the output line 18 of the array that are coupled to the transistor 16. The line 18 had previously been charged to plus 5 volts through device 20 coupling the line 18 to a 5 volt source. The output line 18 therefore goes down when device 16 conducts and discharges it. When the output line is down, any device 22 arranged along it in the Read OR array 24 is turned off providing an up output on the output line 26 of the OR array 24 coupled by device 22 to line 18. If the device 16 is left non-conducting, line 18 will be down biasing device 22 off. With device 22 off the potential on line 26 will be up providing an up output on the output line of the array. Potential on line 26 is maintained through FETs 28 and 30 which has their bias connected so that they act like resistive elements.

Figure 2:
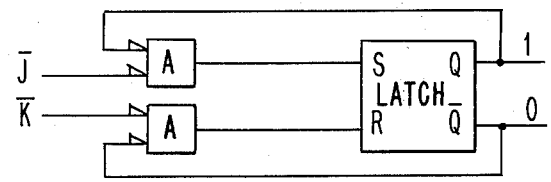
FIG. 2 is a logic block diagram of a JK latch.

The signals on the output lines 26 of the OR array 24 are fed into one of a number of latches 32. For purposes understood by those skilled in the art it is desireable that a number of different types of latches be available to perform logic. One type of latch is the JK latch. As shown in FIG. 2, in this type of latch one input J or K to the latch 50 disabled by feeding both of the outputs Q or Q̄ into an AND gate 52 or 54 along with one of the inputs. The following logic table contains the possible logic states for a JK latch.

| J | K | Q |
|---|---|---|
| 0 | 0 | hold |
| 0 | 1 | S |
| 1 | 0 | R |
| 1 | 1 | T |

Figure 3:
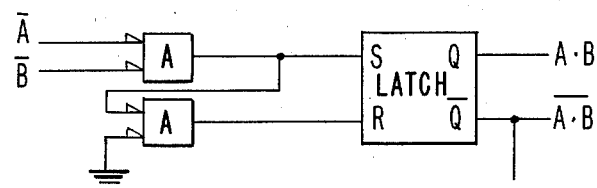
FIG. 3 is a logic block diagram of a polarity hold latch.

Another type of latch that is useful in performing logic is an AND polarity hold latch shown in FIG. 3. When both the inputs A and B of this type of latch are up you obtain a one signal on the Q output otherwise the Q output line is down. This is shown in the following table.

| A | B | Q |
|---|---|---|
| 0 | 0 | hold |
| 0 | 1 | 0 |
| 1 | 0 | 1 |
| 1 | 1 | X |

Figure 4:
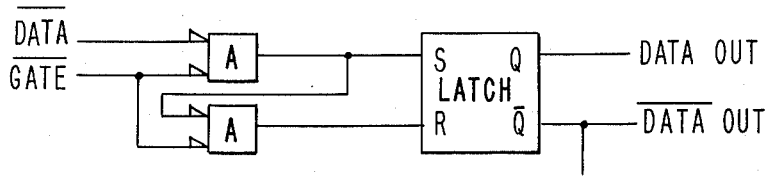
FIG. 4 is a logic block diagram of a gated polarity hold latch.

A third type of circuit that could be desireable is shown in FIG. 4. This latch is referred to as a gated polarity hold. The gated polarity hold latch prevents the data signal DATA from entering the latch when the gate signal GATE is not up.

It is desirable that all three of the above type latches be available at any of the outputs of the array shown in the above mentioned patent application. In accordance with the present invention, a latch circuit is provided that can be transferred into any of the three types of latches with a minimum number of changes in the chip making process. FIG. 5 shows the JK configuration for this latch. The basic latching circuit 34 comprises two cross connected devices J1 and J2 each connected to a 5-volt source by a load device I1 or I2. When J1 is conducting the flip flop is in one of its operating states, the binary 1 state. When J2 is conducting flip flop is in its other operating state or the binary 0 state. The state of the latch can be changed by making the devices H1 and H2 conductive while the devices G1 and G2 are conductive. Devices G1 and G2 are conductive when the MS signal is up so while the MS signal is up an input to line 40 or 42 can cause device J1 or J2 to be rendered non-conductive by biasing the gate of device J1 or J2 below the threshold level.

The inputs to lines 40 or 42 are controlled by AND circuits 44 and 46. During $\overline{MS}$ time device D1 is conductive to charge line 40 through device C1 while device G1 is maintained off to prevent the shunting of the gate to drain voltage of device J2 by the H1, G1 combination. If $\overline{MS}$ time $\overline{J}$ is up it shunts this charge to ground so that there will not be any potential on line 40 when G1 is activated at the MS time. However if $\overline{J}$ is down all during $\overline{MS}$ time device B1 will not be rendered conductive and potential at point 40 will shunt the gate to drain of J2 to ground when device G1 is biased conductive MS time. During MS time the gate of B1 is isolated from the $\overline{J}$ input signal by device A1 which is biased conductive during the period when the MS signal is up.

Thus it can be seen that the state of the latch 34 can be changed through AND gate 44 by the $\overline{J}$ signal from the $\overline{Q}$ state to the Q state by turning device J2 off. In the same manner the $\overline{K}$ signal can change the state of the latch 34 from the $\overline{Q}$ state to the Q state by turning J1 off when a down $\overline{K}$ signal to AND gate 46 during $\overline{MS}$ times. Thus inputs applied to $\overline{J}$ and $\overline{K}$ will change the states of the latch 34 when they are applied to $\overline{J}$ during $\overline{MS}$ time and otherwise will be ineffective at changing the state of the latch.

The gate of device E1 is the input to AND gate 44 that receives the feedback signal from the output 38 of the latch. If Q is up during $\overline{MS}$ time the signal is transferred to the gate of E1 biasing E1 conductive thereby disabling the $\overline{J}$ input. Likewise device E2 is the input device of AND gate 46 that receives the $\overline{Q}$ signal during $\overline{MS}$ time through device K2 disabling the $\overline{K}$ input.

As explained in the above mentioned patent application the latches are connected together to form a shift register so that the state of one latch can be transferred to another latch. This is the purpose of devices F1, F2. When such a transfer from flip flop to flip flop is to occur devices F1, F2 are activated by signal A during MS time allowing the signals on the output lines 38 and 36 of one flip flop to be transferred through devices F1 and F2 into the AND gates 44 and 46 so that AND gates can provide a signal on lines 40 or 42 to change the state of the latch 34.

Figure 6:
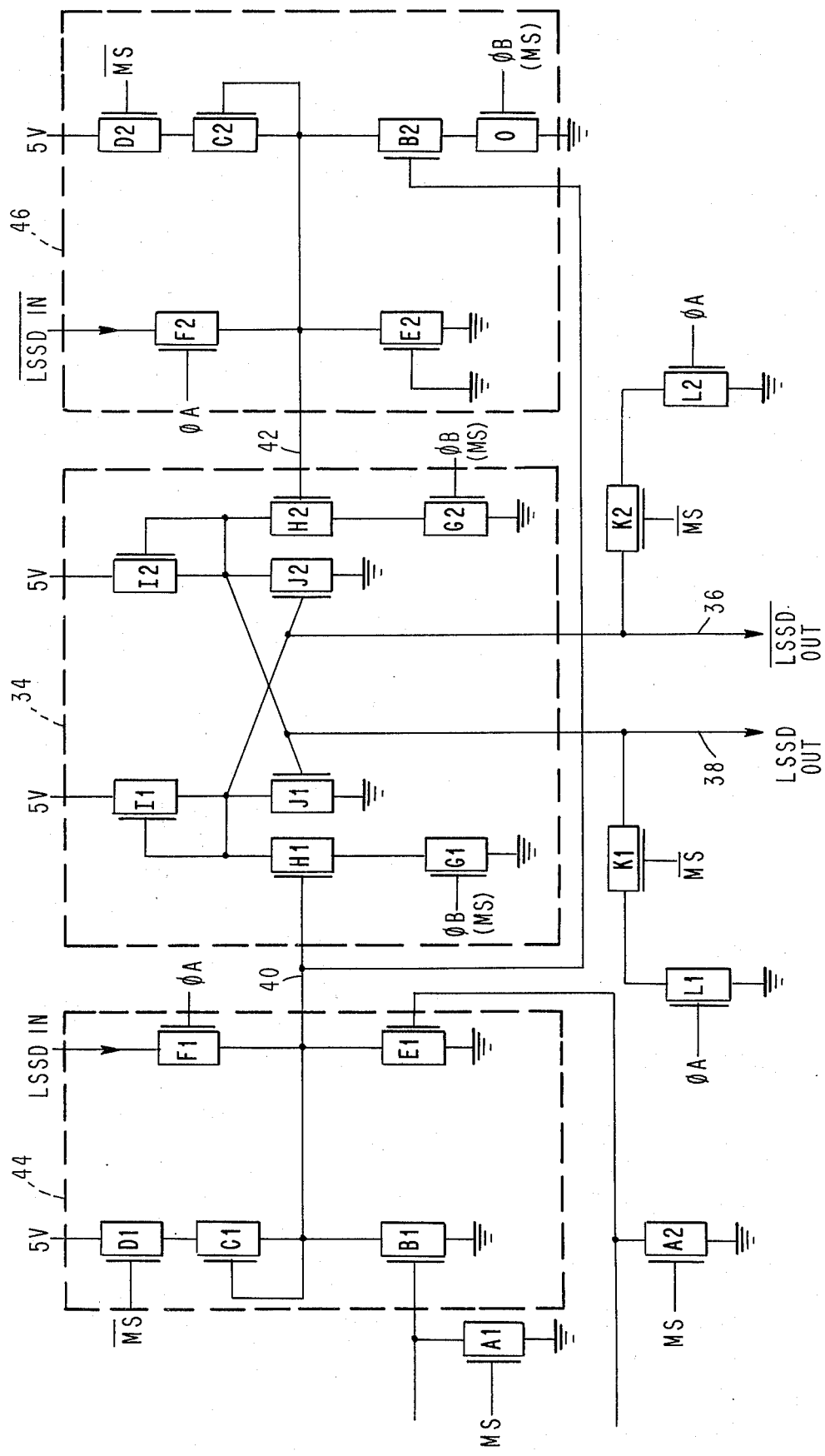
FIG. 6 is a circuit diagram of a polarity hold latch.
Figure 7:
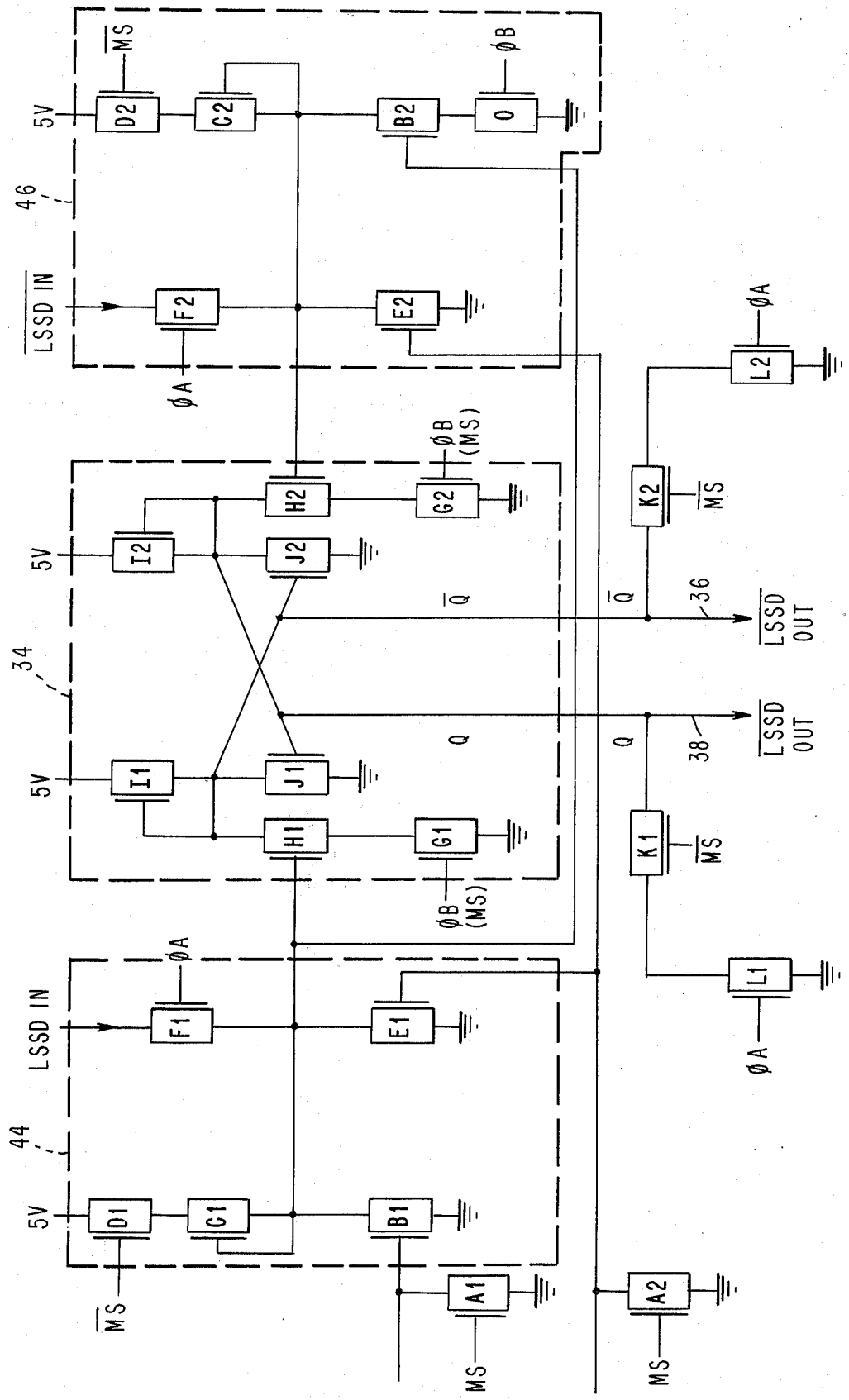
FIG. 7 is a circuit diagram of a gated polarity hold latch.

The circuit in FIG. 6 can be modified as shown in FIG. 7 to obtain the AND polarity hold latch shown schematically in FIG. 4. As can be seen in FIG. 6 the modification involves feeding both inputs from the OR array into the AND gate 44, taking the output of AND gate 44 and feeding it to the gate of device B2 in the other AND gate 46, grounding the gate of device E2, and breaking the feedback loops coupling the outputs 38 and 36 to the devices E1 and E2. Also, the circuit can be used as the gated polarity hold latch shown in FIG. 7 by coupling the gate of E2 to the same input as E1 instead of grounding the gate of E2.

Therefore it can be seen that the circuit is adaptable to at least three different types of latching arrangements. These latching arrangements can all be obtained with the same physical layout by merely changing the metallization pattern of connections shown.

Figure 8:
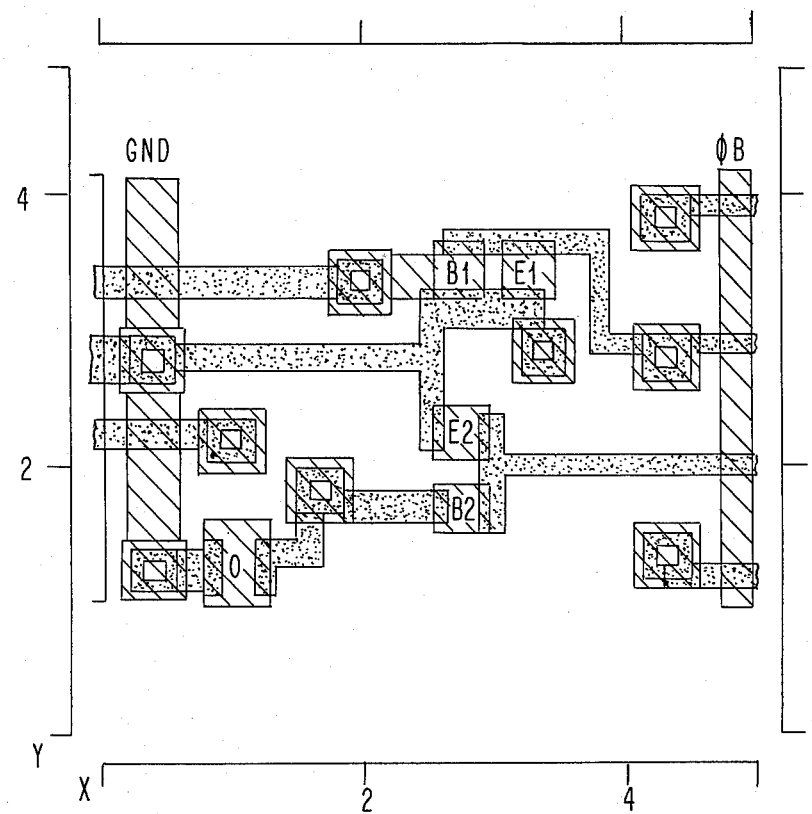
FIG. 8 is a chip layout for common portions of the circuits in FIGS. 1 to 5.

FIG. 8 is a physical layout of the devices B1, E1, E2 and B2 in the latch circuit of FIGS. 5, 6 and 7 on the chip containing the PLA. The speckled lines represent diffusions made into the substrate of silicon chip containing the logic array while the hatched lines represent metallization patterns on an oxide layer on top of the silicon. The rectangular areas with a smaller rectangle in them are holes through the oxide layer for connections through the insulating layer between the diffusions and the metallization pattern.

Figure 9:
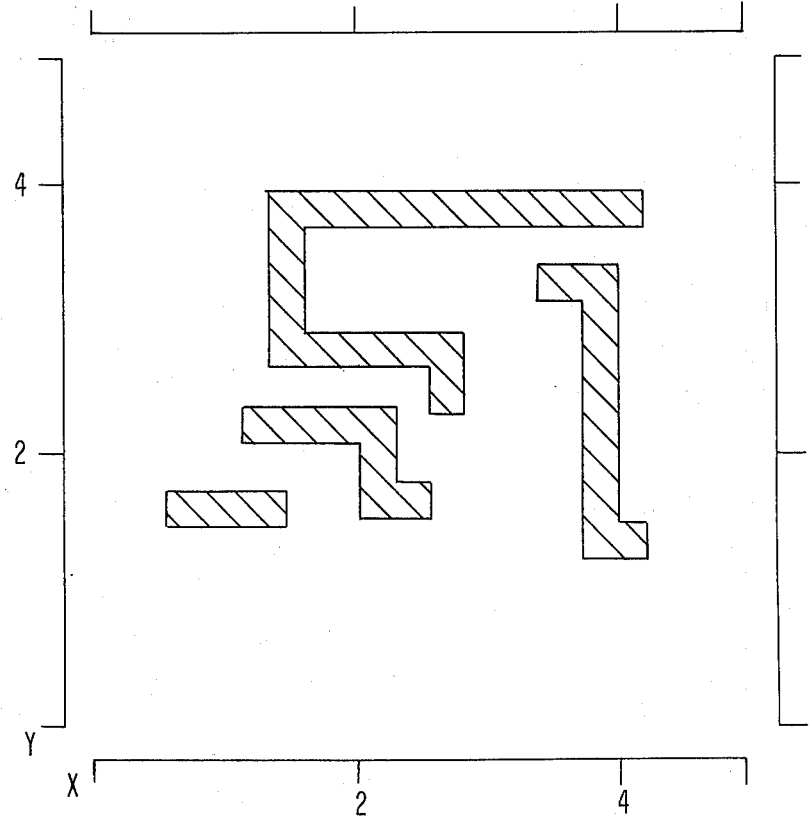
FIG. 9 is the metallization pattern peculiar to the circuit of FIG. 5.

FIG. 9 shows metallization peculiar to a JK trigger. The position of this additional metallization on the layout of FIG. 8 can be seen by aligning the coordinates arranged around the edges of the two figures. FIG. 10 shows the additional metallization needed to obtain the polarity hold latch and FIG. 11 shows the additional metallization needed to obtain the gated polarity hold latch. Thus it can be seen that the latches can be modified quite simply in the same steps that the arrays are personalized to permit a more flexible application of the array chip.

Although we have shown in detail only the modification of the latches of the gated polarity hold circuit other circuits may also be modified in the array in the same manner. For instance, the array chip drivers 48 which receive their inputs from the outputs of the latches 32 can be modified by enabling and disabling the connection between the gate of device 49 so that the off chip driver 49 can be changed from a single stage driver to a multi stage driver.

Obviously other changes can be made in the scope of the invention. Therefore it should be obvious to those skilled in the art that many changes can be made in the above embodiment of the invention without departing from the spirit and scope of the invention.

What is claimed is:

1. In a programmable logic array chip comprising at least two arrays and a string of latches in which one of the arrays receives interrogation signals from decoders, feeds the responses thereto to the second array which in turn supplies inputs to the latches which can transfer data bits from one to another, new latches each latch comprising:

a bi stable circuit having:
  two three terminal semiconductor devices each with a control terminal and two controlled terminals with the control terminal of each semiconductor coupled to a controlled terminal of the other three terminal semiconductor device,
  two load devices each for coupling the controlled terminals of three terminal semiconductor devices in series with a source of potential so that when one of the three terminal semiconductor devices is conducting state the other is in an off state;
two, two input AND gates each with its output coupled to a different one of the control terminals of the three terminal semiconductor devices so that application of two inputs to either AND gates will determine which one of the three terminal semiconductor devices is in the off state;
data transfer means for coupling the outputs of each of AND gates of each latch to the control terminal of one of the three terminal semiconductor devices of the preceding latch in the string of latches to enable changing of the state of each latch with the information stored in the preceding latch independently of the inputs to the AND gates; and,
selective coupling means coupling inputs of the AND gates to different outputs of the second array, the bi stable circuit and clocking pulses in different configurations in different latches in the string whereby the string of latches contains different types of latches.

2. The programmable logic array chip of claim 1 wherein said chip comprises:
  a monolithic substrate,
  an insulating layer upon the monolithic substrate,
  metallization upon the insulating layer for joining overlying diffusions to form the logic circuitry of the latch; and
  said selective coupling means comprises portions of the metallization that can be changed to change the operating function of the latch.

3. The programmable logic array chip of claim 2 wherein said selective coupling means comprises a connection from the second array to each of the AND gates and a connection to an input of each of the AND gates from either the true or complement terminals of the bi stable circuit.

4. The programmable logic array chip of claim 2 wherein the selective coupling means comprises a connection to the two terminals of one of the AND gates from the second array and a connection to one of the terminals of the other of the AND gate from the output of said one of the AND gates.

5. The programmable logic array chip of claim 2 wherein the selective coupling means comprises a connection between the second array and one of the AND gates and a connection to inputs of both of the AND gates from a source of gating signals.

* * * * *